(12) United States Patent
Chen

(10) Patent No.: US 10,051,889 B2
(45) Date of Patent: Aug. 21, 2018

(54) ELECTRONIC CIGARETTE

(71) Applicant: Shenzhen Smoore Technology Limited, Shenzhen (CN)

(72) Inventor: Zhiping Chen, Shenzhen (CN)

(73) Assignee: Shenzhen Smoore Technology Limited, Shenzhen (CN)

( * ) Notice: Subject to any disclaimer, the term of this patent is extended or adjusted under 35 U.S.C. 154(b) by 658 days.

(21) Appl. No.: 14/661,563

(22) Filed: Mar. 18, 2015

(65) Prior Publication Data

US 2015/0374040 A1    Dec. 31, 2015

(30) Foreign Application Priority Data

Jun. 26, 2014    (CN) .......................... 2014 1 0299417

(51) Int. Cl.
  *A24F 47/00*     (2006.01)
  *G01R 31/04*    (2006.01)

(52) U.S. Cl.
  CPC ............ *A24F 47/008* (2013.01); *G01R 31/04* (2013.01)

(58) Field of Classification Search
  CPC ... A24F 47/008; G06F 13/387; H05B 1/0244; G01R 31/04
  See application file for complete search history.

(56) References Cited

U.S. PATENT DOCUMENTS

| | | | |
|---|---|---|---|
| 6,155,268 A | 12/2000 | Takeuchi | |
| 2011/0265806 A1* | 11/2011 | Alarcon | A24F 47/00 131/273 |
| 2013/0255702 A1 | 10/2013 | Griffith, Jr. et al. | |
| 2014/0062417 A1 | 3/2014 | Li et al. | |
| 2014/0254055 A1 | 9/2014 | Xiang | |

FOREIGN PATENT DOCUMENTS

| | | |
|---|---|---|
| CN | 102940313 A | 2/2013 |
| CN | 202890465 U | 4/2013 |
| CN | 203166462 U | 8/2013 |
| CN | 103280852 A | 9/2013 |

(Continued)

OTHER PUBLICATIONS

European Search Report for European Application No. 15159777.0, dated Nov. 20, 2015.

(Continued)

*Primary Examiner* — Shogo Sasaki
(74) *Attorney, Agent, or Firm* — HoustonHogle LLP

(57) ABSTRACT

An electronic cigarette includes a control chip, the control chip includes: a driving module configured to output a current to drive the electronic cigarette to work; an open-circuit detecting module electrically connected to the driving module, and configured to sample and detect the current, and send out an open-circuit enable signal when a sampled current is less than a internal reference current; a short-circuit detecting module electrically connected to the driving module, and configured to sample and detect the current, and send out a short-circuit enable signal when the sampled current is greater than the internal reference current; and a control module electrically connected to the driving module, and configured to receive the open-circuit enable signal and the short-circuit enable signal, and send a shutdown signal to the driving module.

11 Claims, 3 Drawing Sheets

(56) References Cited

FOREIGN PATENT DOCUMENTS

| CN | 203368107 U | 12/2013 |
| CN | 203446536 U | 2/2014 |
| CN | 103653261 A | 3/2014 |
| EP | 2489391 A1 | 8/2012 |
| WO | 2014066730 A1 | 5/2014 |

OTHER PUBLICATIONS

European Search Report for European Application No. 15159783.8, dated Nov. 24, 2015.

* cited by examiner

ELECTRONIC CIGARETTE

RELATED APPLICATIONS

This application claims priority under 35 U.S.C. § 119 to Chinese Patent Application No. 201410299417.2, filed Jun. 26, 2014. The entire teachings of the above application is incorporated herein by reference.

FIELD OF THE INVENTION

The present disclosure relates to the field of electronic devices, and more particularly relates to an electronic cigarette.

BACKGROUND OF THE INVENTION

An electronic cigarette is a battery-powered electronic device implementing an effect of smoking. The electronic cigarette achieves the effect of smoking by detecting the movement of airflow via an internal detecting module to estimate whether the electronic cigarette is at smoking status or not, and operating a heater strip. In order to facilitate operation by a user, the electronic cigarette generally has a smoke tube with an outline similar to a common cigarette, and a battery, a metallic sleeve, a control chip, a heater strip, wires and tobacco tar are assembled within the smoke tube.

In the productive process of a conventional electronic cigarette, generally, the control chip is directly welded onto a control circuit board, and then implanted into the metallic sleeve of the electronic cigarette, so as to complete the assembling of the electronic cigarette. During this assembling process, a driving end of the control chip may easily get short-circuited with the sleeve causing the chip to be instantaneously heated, and may even burn up. Moreover, since the heater strip is connected to the wire in the form of welding or riveting, these kinds of direct connection are not stable enough, and easily open-circuited. However, there is no one electronic cigarette having a control chip capable of synchronously implementing open-circuit detecting and short-circuit detecting, and carrying out an open-circuit protection and a short-circuit protection until now.

SUMMARY OF THE INVENTION

Accordingly, it is necessary to provide an electronic cigarette having the functions of open-circuit detecting and short-circuit detecting, and being simply designed and easily assembled.

An electronic cigarette includes a control chip, the control chip includes: a driving module configured to output a current to drive the electronic cigarette to work; an open-circuit detecting module electrically connected to the driving module, and configured to sample and detect the current, and send out an open-circuit enable signal when the sampled current is less than an internal reference current; a short-circuit detecting module electrically connected to the driving module, and configured to sample and detect the current, and send out a short-circuit enable signal when the sampled current is greater than the internal reference current; and a control module electrically connected to the driving module, and configured to receive the open-circuit enable signal and the short-circuit enable signal, and send a shutdown signal to the driving module.

In an embodiment, the open-circuit detecting module includes an open-circuit protecting unit, and the short-circuit detecting module includes a short-circuit protecting unit.

In an embodiment, the driving module includes an over current protecting unit.

In an embodiment, the control module includes an under voltage protecting unit.

In an embodiment, the control chip further includes a smoking detecting module electrically connected to the control module, and configured to detect a smoking action of a user, and send a smoking flag bit to the control module for starting the electronic cigarette or a standby flag bit to the control module for shutting down the electronic cigarette.

In an embodiment, the control chip further includes a charging module electrically connected to the control module, the charging module includes a multiplexing port acting or working as an output port and a charging input port, the multiplexing port is configured to charge and discharge.

In an embodiment, the control chip further includes a display module electrically connected to the control module, the display module is configured to respectively display a normal smoking status, a low battery status, an open-circuit/short-circuit status, and a shut down status.

In an embodiment, the electronic cigarette further includes an airflow sensor connected to the smoking detecting module, a heater strip connected to the driving module, an indicator light connected to the display module and a power supply connected to the charging module.

In an embodiment, the smoking detecting module presets several different capacitance variation thresholds.

In an embodiment, the smoking detecting module presets four capacitance variation thresholds of 3%, 6%, 9% and 12%.

The present electronic cigarette samples the current via the open-circuit detecting module and the short-circuit detecting module, it can synchronously implement open-circuit detecting and short-circuit detecting, and carry out an open-circuit protection and a short-circuit protection, being simply designed and easily assembled.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION OF THE EMBODIMENTS

Figure 1:
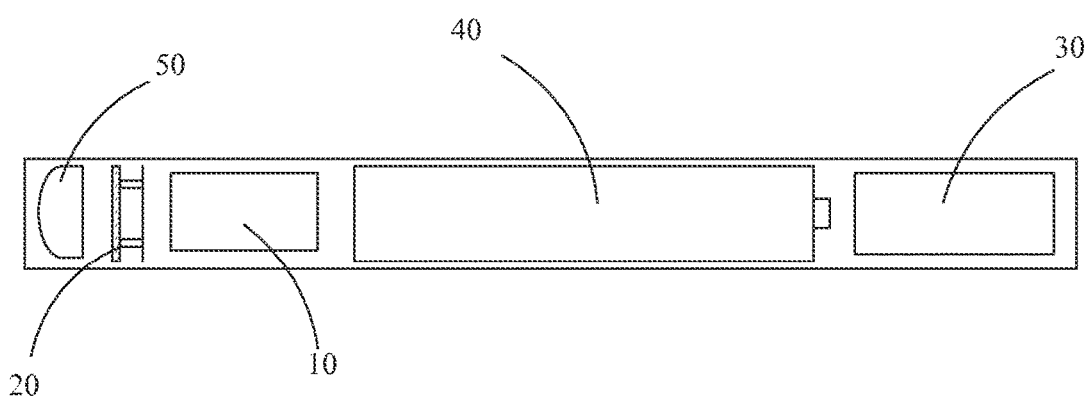
FIG. 1 is a schematic diagram of an electronic cigarette in accordance with an embodiment.
Figure 2:
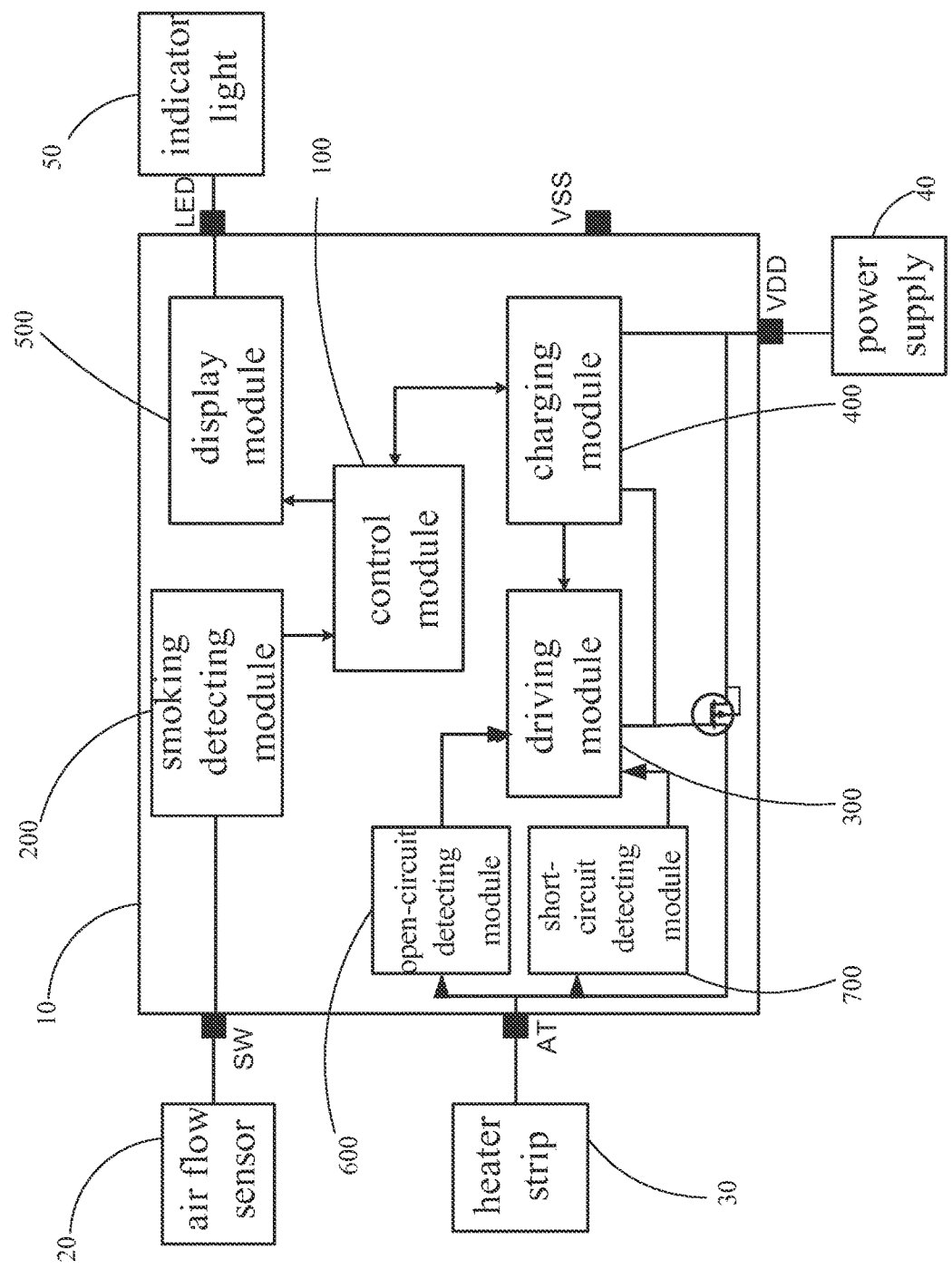
FIG. 2 is a function block diagram of the electronic cigarette in accordance with the embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements. Referring to FIG. 1 and FIG. 2, in an embodiment, the electronic cigarette includes a control chip 10, an indicator light 50 located at an end of the electronic cigarette and connected to the control chip 10, an airflow sensor 20 adjacent to the indicator light 50, a power supply 40 electrically connected to the control chip 10, and a heater strip 30 adjacent to the power supply 40. The control chip 10 includes a control module 100, a smoking detecting module 200, a driving module 300, a charging module 400, and a display module 500. Specifically, the airflow sensor 20 is connected to the smoking detecting module 200, and configured to sense a changing of the airflow; the heater strip 30 is connected to the driving module 300, and configured to heat the tobacco tar, so as to simulate an effect of smoking; an anode of the power supply 40 is connected to the charging module 400, and configured to supply electric power to the electronic cigarette; and the indicator light 50 is connected to the display module 500, and configured to display status of the electronic cigarette.

The control module 100 includes an under voltage protecting unit, and the driving module 300 includes an over current protecting unit.

The smoking detecting module 200 is electrically connected to the control module 100, and configured to detect a smoking action of a user, and send a smoking flag bit State 1 for starting the electronic cigarette or a standby flag bit State 0 for shutting down the electronic cigarette to the control module 100. In the case of normal smoking, the smoking detecting module 200 estimates whether the user is smoking or not according to the capacitance change of the airflow sensor 20. If the user is smoking, the smoking flag bit State 1 will be sent to the control module 100, otherwise, the standby flag bit State 0 will be sent to the control module 100.

The driving module 300 is electrically connected to the control module 100 for outputting current under the control of the control module 100, so as to drive the heater strip 30 to perform heating.

The control chip 10 further includes an open-circuit detecting module 600 electrically connected to the driving module 300 and a short-circuit detecting module 700 electrically connected to the driving module 300, wherein the open-circuit detecting module 600 is in parallel with the short-circuit detecting module 700. The open-circuit detecting module 600 includes an open-circuit protecting unit, and the short-circuit detecting module 700 includes a short-circuit protecting unit.

The open-circuit detecting module 600 is electrically connected to the driving module 300, and configured to sample and detect the current outputted by the driving module 300. The open-circuit detecting module 600 has a current comparator, if the sampled current is less than an internal reference current, the detecting result is open-circuited, and the open-circuit detecting module 600 will send out an open-circuit enable signal OP.

The short-circuit detecting module 700 is electrically connected to the driving module 300, and configured to sample and detect the current outputted by the driving module 300. The short-circuit detecting module 700 also has a current comparator, if the sampled current is greater than the internal reference current, the detecting result is short-circuited, and the short-circuit detecting module 700 will send out a short-circuit enable signal SCP.

Specifically, the control module 100 appropriately controls the driving module 300 in accordance with the smoking flag bit State 1 and the standby flag bit State 0 of the smoking detecting module 200. When the control module 100 receives the smoking flag bit State 1 sent from the smoking detecting module 200, and the voltage of the power supply 40 is normal, the control module 100 controls the driving module 300 to output current to the heater strip 30. When the control module 100 receives the standby flag bit State 0 sent from the smoking detecting module 200, the open-circuit enable signal OP sent from the open-circuit detecting module 600 or the short-circuit enable signal SCP sent from the short-circuit detecting module 700, or the power supply 40 is under voltage, the control module 100 sends a shutdown signal to the driving module 300 to shut down the driving module 300.

The advantage of sampling the current outputted by the driving module 300 is that it can detect whether the circuit is open-circuited or short-circuited according to the anomaly of the current, and the detecting result is accurate. Due to the close relation between the detecting voltage and the power supply working voltage, when the voltage of the power supply changes, sampling the voltage may cause a relatively large deviation in the detecting result.

The charging module 400 is electrically connected to the control module 100. The charging module 400 includes a multiplexing port working as an output port and a charging input port, the multiplexing port is configured to charge and discharge. The charging module 400 has a constant current mechanism and a constant voltage mechanism, and can perform safe charging.

The display module 500 is electrically connected to the control module 100, and configured to prompt the indicator light 50 to respectively display normal smoking status, low battery status, open-circuit/short-circuit status, and shut down status.

Specifically, when the control module 100 receives the smoking flag bit State 1 sent from the smoking detecting module 200, and the voltage of the power supply 40 is normal, the control module 100 controls the display module 500 to display the normal smoking status. When the power supply 40 is under voltage, the under voltage protecting unit in the control module 100 sends a low battery signal to the display module 500, and the display module 500 displays the low battery status. When the control module 100 receives the open-circuit enable signal OP sent from the open-circuit detecting module 600 or the short-circuit enable signal SCP sent from the short-circuit detecting module 700, the control module 100 sends an open-circuit/short-circuit displaying signal to the display module 500, and the display module 500 displays the open-circuit/short-circuit status. When the control module 100 receives the standby flag bit State 0 sent from the smoking detecting module 200, the control module 100 controls the display module 500 to display the shut down status.

The smoking detecting module 200 may preset several different capacitance variation thresholds for different airflow sensors. In an embodiment, the smoking detecting module presets four capacitance variation thresholds of 3%, 6%, 9%, and 12%.

Figure 3:
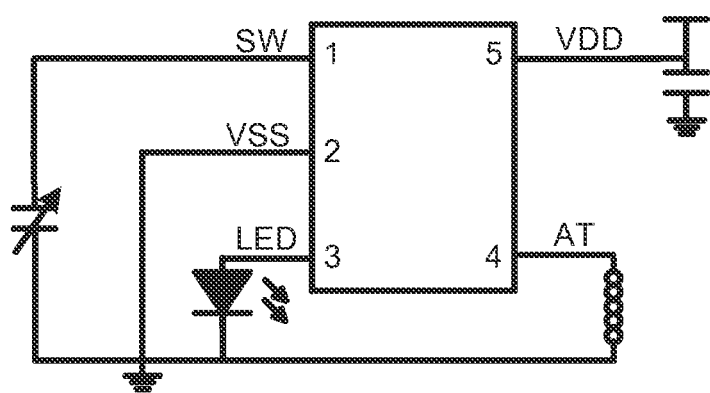
FIG. 3 is a schematic diagram of a control chip of the electronic cigarette in accordance with the embodiment.

In an embodiment, the control chip 10 employs a SOT23-5 package (small out-line transistor 23-5 package), and receives various modules therein. Referring to FIG. 2 and FIG. 3, the control chip 10 includes a positive power supply pin VDD connected to the anode of the power supply 40, a grounding port VSS connected to ground point GND, an output port AT connected to the heater strip 30, a display port LED connected to the indicator light 50, and an input port SW connected to the airflow sensor 20. In consideration of the miniaturization of the control chip 10 and in order to avoid increasing the number of pins, in one example the output port AT simultaneously works as a detecting port.

The electronic cigarette employs the open-circuit detecting module 600 and the short-circuit detecting module 700 to sample and detect the current outputted by the driving module 300, and implements the protecting function of the control chip 10 via the open-circuit protecting unit and the short-circuit protecting unit. The indicator light 50 can clearly display different statuses such as normal smoking status, low battery status, open-circuit/short-circuit status, and shut down status, enhancing a user's reliability of the electronic cigarette. In addition, the electronic cigarette is simply designed and easily assembled.

The embodiments described above only show a few implement manners of the present invention, the description is specific and detailed, but it cannot be interpreted as a limitation of the range of the present invention. What should be pointed out is that it is apparent to those skilled in the art that a variety of modifications and changes may be made without departing from the scope of the present invention. Thus, the range of the present invention should be defined by the appended claims.

What is claimed is:

1. An electronic cigarette comprising:
    a heater strip configured to heat tobacco tar in response to receiving a current; and
    a control chip comprising:
        a driving module configured to output the current to the heater strip;
        an open-circuit detecting module electrically connected to the driving module and configured to sample and detect the current output by the driving module, the open-circuit detecting module comprising a current comparator for determining whether the sample current is less than an internal reference current, wherein the open-circuit detecting module outputs an open-circuit enable signal in response to determining that the sampled current is less than the internal reference current;
        a short-circuit detecting module electrically connected to the driving module and configured to sample and detect the current output by the driving module, the short-circuit detecting module comprising a current comparator for determining whether the sampled current is greater than the internal reference current, wherein the short-circuit detecting module outputs a short-circuit enable signal in response to determining that the sampled current is greater than the internal reference current;
        a control module electrically connected to the driving module and configured to send a shutdown signal to the driving module in response to receiving at least one of the open-circuit enable signal from the open-circuit detecting module or the short-circuit enable signal from the short-circuit detecting module,
    wherein the open-circuit detecting module is parallel with the short-circuit detecting module.

2. The electronic cigarette according to claim 1, wherein the control module comprises an under voltage protecting unit, which, in response to determining that a power supply of the electronic cigarette is under voltage, sends a low battery signal to a display module of the electronic cigarette, which displays a low battery status via an indicator light of the electronic cigarette.

3. The electronic cigarette according to claim 1, wherein the control chip further comprises a smoking detecting module electrically connected to the control module, and configured to detect a smoking action of a user, wherein if the smoking action is detected, the smoking detecting module sends a smoking flag bit to the control module for starting the electronic cigarette, and otherwise the smoking detecting module sends a standby flag bit to the control module for shutting down the electronic cigarette.

4. The electronic cigarette according to claim 3, wherein the smoking detecting module detects the smoking action based on several different preset capacitance variation thresholds for different airflow sensors.

5. The electronic cigarette according to claim 3, wherein the smoking detecting module detects the smoking action based on four capacitance variation thresholds of 3%, 6%, 9%, and 12% for airflow sensors.

6. The electronic cigarette according to claim 1, wherein a power supply supplies power to the control chip via a charging module electrically connected to the control module and an anode of the power supply, the charging module comprises a multiplexing port working as an output port and a charging input port, and the multiplexing port is configured to charge and discharge.

7. The electronic cigarette according to claim 1, wherein the control chip further comprises a display module electrically connected to the control module, the display module being configured to respectively display via an indicator light of the electronic cigarette a normal smoking status, a low battery status, an open-circuit/short-circuit status, and a shut down status based on signals from the control module.

8. The electronic cigarette according to claim 1, further comprising an airflow sensor of the electronic cigarette connected to a smoking detecting module of the control chip, wherein the smoking detecting module sends signals to the control module based on whether the airflow sensor senses a changing of airflow.

9. The electronic cigarette according to claim 1, wherein the heater strip is configured to heat tobacco tar to simulate an effect of smoking.

10. The electronic cigarette according to claim 1, further comprising an indicator light of the electronic cigarette connected to a display module of the control chip, wherein the indicator light is configured to display a status of the electronic cigarette.

11. The electronic cigarette according to claim 1, further comprising a power supply of the electronic cigarette connected to a charging module of the control chip, wherein the power supply is configured to supply electric power to the electronic cigarette.

* * * * *